United States Patent [19]

Knierim

[11] Patent Number: 5,399,988
[45] Date of Patent: Mar. 21, 1995

[54] $f_T$ DOUBLER AMPLIFIER
[75] Inventor: Daniel G. Knierim, Beaverton, Oreg.
[73] Assignee: Tektronix, Inc., Wilsonville, Oreg.
[21] Appl. No.: 182,606
[22] Filed: Jan. 14, 1994
[51] Int. Cl.$^6$ .............................................. H03F 3/45
[52] U.S. Cl. .................................. 330/149; 330/252; 330/311
[58] Field of Search ................. 330/149, 252, 260, 311

[56] References Cited

U.S. PATENT DOCUMENTS

| | | | |
|---|---|---|---|
| 3,633,120 | 1/1972 | Battjes | 330/295 X |
| 4,267,516 | 5/1981 | Traa | 330/149 |
| 4,774,475 | 9/1988 | LaVoie | 330/149 |
| 4,804,926 | 2/1989 | Woo | 330/149 |

Primary Examiner—James B. Mullins
Attorney, Agent, or Firm—William A. Birdwell; Boulden G. Griffith

[57] ABSTRACT

A transistor amplifier having a main amplifier exhibiting a substantially doubled $f_T$ characteristic and having error cancellation circuitry, wherein the standing current of the error cancellation circuitry is reused in powering the main amplifier. The main amplifier comprises an outer differential pair of transistors and an inner differential pair of transistors, each differential pair having an inverting side and a non-inverting side. The collectors of the transistors of the non-inverting side of the differential pairs are connected, respectively, at a first current summing node. The collectors of the transistors of the inverting side of the differential pairs are connected, respectively, at a second current summing node. The $f_T$ doubler transistor amplifier also employs level shifter stages to shift the input signals for application to the error cancellation circuitry, the level shift being an amount predetermined to substantially center the error cancellation circuitry in its dynamic range of operation. The $f_T$ doubler transistor amplifier also provides current sources which contribute to powering the main amplifier and which source current in amounts predetermined to control positive feedback from the main amplifier to the error cancellation circuitry so as to enhance accurate cancellation of errors.

27 Claims, 1 Drawing Sheet

$F_T$ DOUBLER AMPLIFIER

BACKGROUND OF THE INVENTION

This invention relates to transistor amplifiers, and particularly to $f_T$ doubler transistor amplifiers that employ error cancellation circuitry while maintaining substantially unchanged the overall device power dissipation.

It is generally desirable to provide transistor amplifiers capable of operating at high frequencies, particularly for application in electronic systems and instruments such as oscilloscopes and other precision measurement instruments requiring high bandwidth. However, a transistor amplifier's gain is a function of the frequency of the input signal, such that the gain generally is highest for low frequency input signals and decreases as the input signal's frequency increases. Typically, the gain of transistor amplifiers begins to roll off at a frequency determined by, among other things, the input signal's finite source impedance in conjunction with base storage and parasitic junction capacitances of the amplifier's transistors. The roll off characteristically is initially at 6 dB/octave. As the signal frequency increases, additional low-pass filter characteristics often arise, each of which increases the rate of roll off by 6 dB/octave. At some frequency, the current gain typically falls to unity, that frequency typically being designated as $f_T$.

Accordingly, it is desirable in high frequency applications to employ transistor amplifiers having suitably high $f_T$ characteristics. Such transistor amplifiers may be obtained by using appropriate manufacturing methods, including by using semiconductor materials conducive to high frequency operation as well as by using manufacturing processes and device geometries that reduce the base storage and parasitic junction capacitances of the amplifier's transistors. However, for any particular manufacturing method resulting in a characteristic $f_T$, proper circuit design of the transistor amplifier can provide an effective $f_T$ that is substantially greater than the characteristic $f_T$ of the amplifier's component transistors.

One transistor amplifier using such a circuit design is described in U.S. Pat. No. 3,633,120, which is assigned to the assignee of the present invention and hereby incorporated by reference. The $f_T$ doubler transistor amplifier described therein includes first and second pairs of transistors where the outputs of the transistor pairs are coupled in parallel and a common input current is provided in series to the four transistors, the effect being to substantially double the current gain. Thence, the $f_T$ characteristic of the transistor amplifier is doubled, that is, the frequency at which practical amplifier operation is achievable is approximately doubled. However, this transistor amplifier is subject to nonlinearity and thermally-induced distortion inherent in the fundamental physical operation of its transistor junctions.

Another $f_T$ doubler transistor amplifier is described in U.S. Pat. No. 4,267,516 which is also assigned to the assignee of the present invention and hereby incorporated by reference. The amplifier comprises a main amplifier and an error correction amplifier connected thereto. The error correction amplifier is introduced to improve linearity while maintaining the enhanced frequency response of the $f_T$ doubler. However, the error correction amplifier requires bias current that is not reused in the main amplifier. Consequently, overall device power dissipation is increased in employing the error correction amplifier.

Another $f_T$ doubler transistor amplifier is described in U.S. Pat. No. 4,774,475, which is also assigned to the assignee of the present invention and hereby incorporated by reference. The amplifier employs a main amplifier and two error correction amplifiers, wherein the error correction amplifiers reuse the main amplifier's bias currents. The error correction amplifiers are in series connection with the main amplifier so as to cancel nonlinearities and thermally-induced distortion. The current used to bias the error correction amplifiers is reused in biasing the main amplifier. However, the error correction amplifiers require a controlling voltage which is generated by a pair of transistors, those transistors being matched and biased by matched current sources. The currents of these current sources are not reused in the main amplifier. Moreover, the main amplifier employs a center-tap to which a reference signal is applied so as to drive the mid-point of the main amplifier, that is, to balance the bases of the internal transistors of the two differential pairs of the main amplifier. The continuing accuracy of this reference signal is significant to the proper functioning of the error correction amplifiers, but is difficult to maintain.

Accordingly, there is a need for an improved transistor amplifier which provides the enhanced frequency response of an $f_T$ doubler transistor amplifier while also overcoming nonlinearities and thermally-induced distortion, without substantially changing the overall device power dissipation.

SUMMARY OF THE INVENTION

The present invention solves the aforementioned problem for transistor amplifiers operating at high frequency and fulfills the aforementioned needs by providing an $f_T$ doubler transistor amplifier having a main amplifier exhibiting a substantially doubled $f_T$ characteristic and having error cancellation circuitry, wherein the standing current of the error cancellation circuitry is reused in powering the main amplifier. The $f_T$ doubler transistor amplifier of the present invention also employs level shifter stages to shift the input signals for application to the error cancellation circuitry, the level shift being an amount predetermined to substantially center the error cancellation circuitry in its dynamic range of operation when a balanced differential input signal is applied to the transistor amplifier. The $f_T$ doubler transistor amplifier of the present invention also provides current sources which contribute to powering the main amplifier and which source current in amounts predetermined to control positive feedback from the main amplifier to the error cancellation circuitry so as to enhance accurate cancellation of errors over the dynamic range of the amplifier.

In a preferred embodiment, the $f_T$ doubler transistor amplifier's main amplifier comprises an outer differential pair of transistors and an inner differential pair of transistors. Each differential pair has an inverting side and a non-inverting side. The differential input signal is received at the respective bases of the outer differential pair and, through the base-emitter junction of the outer differential pair, at the bases of the inner differential pair. The collectors of the transistors of the non-inverting side of the differential pairs are connected, respectively, at a first current summing node. The collectors of the transistors of the inverting side of the differential pairs are connected, respectively, at a second current summing node. Having such summing connections, the amplifier provides, for a given voltage input at a given frequency, substantially twice the current gain than would be provided by a single differential pair alone.

The emitters of the differential pairs' transistors are connected to constant current sources. Interposed between the emitters and the constant current sources is the error cancellation circuitry. That circuitry senses differential changes in the $V_{be}$s of each of the main amplifier's respective differential pair transistors, such changes corresponding to nonlinearity and thermal distortion errors. In response thereto, the error cancellation circuitry produces currents which cancel the error currents generated by the differential $V_{be}$ errors of the main amplifier. The standing current used in the error cancellation circuitry is reused in powering the main amplifier.

In the preferred embodiment, the emitters of the two differential pairs' transistors are each connected to constant current sources that do not provide power to the error cancellation circuitry. Each of these current sources provides a predetermined amount of current, that amount being determined based on factors including the load driven by the amplifier and the possibility of positive feedback from the main amplifier to the error cancellation circuitry. The ratio of currents among all of the amplifier's current sources provides for accurate error cancellation across the dynamic range of the transistor amplifier. The sum of the currents provided by all of the amplifier's current sources preferably is substantially the same as the current necessary to power the main amplifier alone, so as to not substantially change device power dissipation.

In the preferred embodiment, the level shifter stages comprise $f_T$ doubler transistor amplifiers having $f_T$'s substantially matching the $f_T$ of the main amplifier. The standing currents of the level shifter stages are reused to bias cascode transistors connected to the collectors of the differential pair transistors. Reuse of this current improves the performance of the cascode transistors in controlling Miller effect when the amplifier's dynamic range is exceeded.

Accordingly, it is a principle object of the present invention to provide a novel and improved transistor amplifier.

It is another object of the present invention to provide such an amplifier having an $f_T$ characteristic corresponding to high frequency capability.

It is a further object of the present invention to provide such an amplifier having an $f_T$ characteristic substantially double that of its component transistors.

It is yet another object of the present invention to provide such an amplifier having error cancellation circuitry to overcome nonlinearities and thermal distortion.

It is yet a further object of the present invention to provide such an amplifier wherein the error cancellation circuitry senses differential $V_{be}$ errors so as to generate currents that cancel error currents resulting from such differential errors.

It is another object of the present invention to provide such an amplifier having error cancellation circuitry that introduces no substantial change in device power dissipation.

It is a further object of the present invention to provide such an amplifier which reuses the standing currents of the error cancellation circuitry in powering the main amplifier.

It is yet another object of the present invention to provide such an amplifier having current sources connected to the main amplifier which provide for accurate error cancellation throughout the dynamic range of the amplifier.

The foregoing and other objects, features and advantages of the invention will be more readily understood upon consideration of the following detailed description of the invention, taken in conjunction with the accompanying drawing.

DESCRIPTION OF THE PREFERRED EMBODIMENT

Figure 1:
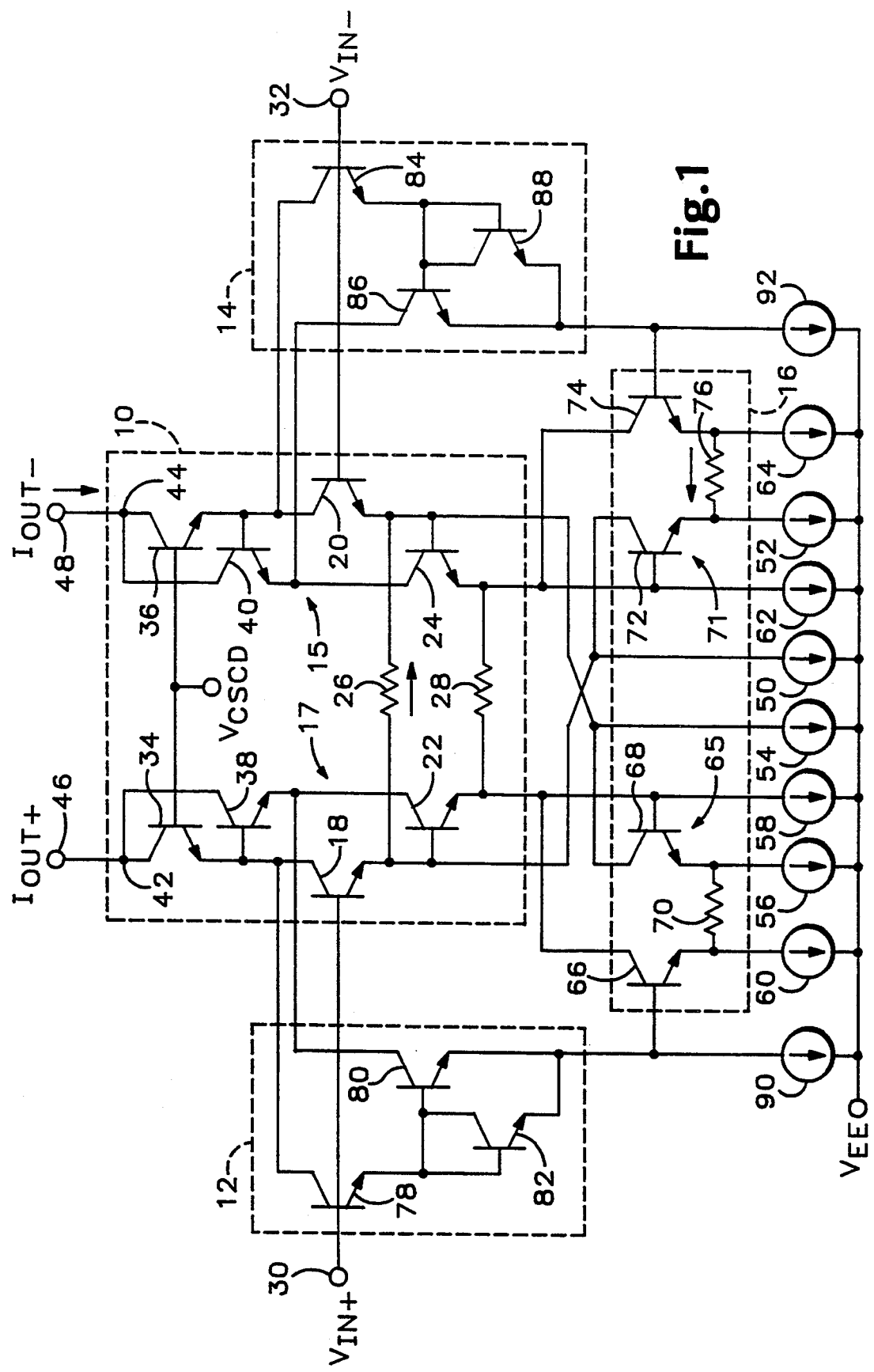
FIG. 1 is a schematic diagram of a transistor amplifier according to the present invention.

Referring to FIG. 1, the transistor amplifier of the present invention includes a main amplifier 10, a first level shifter stage 12, a second level shifter stage 14 and error cancellation circuitry 16. The main amplifier 10 comprises an outer differential pair of transistors 18 and 20, and an inner differential pair of transistors 22 and 24, each of said differential pairs having an inverting side 15 and a non-inverting side 17. The transistors 18 and 20 have their respective emitters coupled together through a resistor 26. Similarly, the transistors 22 and 24 have their respective emitters coupled together through a resistor 28.

The transistor amplifier receives differential input signals $V_{in+}$ and $V_{in-}$ at respective input terminals 30 and 32 and, via terminals 30 and 32, the input signals are received by the main amplifier at the bases of transistors 18 and 20, respectively, of the outer differential pair. The input signals $V_{in+}$ and $V_{in-}$ are received at the bases of transistors 22 and 24, respectively, of the inner differential pair via the base-emitter junction of transistors 18 and 20 respectively. Thence, the differential input signals, as applied to the inner differential pair transistors, are level shifted by the base-emitter junction voltage of the transistors 18 and 20. The transistors 18 and 20 generally are matched, as is discussed further hereinafter, so that the characteristics of the base-emitter junction voltages of the transistors 18 and 20 are substantially the same.

The collectors of transistors 18, 20, 22 and 24 are connected to the emitters of respective transistors 34, 36, 38 and 40. A fixed bias voltage $V_{CSCD}$ is applied both to the bases of transistors 34 and 36 and, after a base-emitter junction voltage drop across transistors 34 and 36, to the bases of transistors 38 and 40. Each pair of transistors 18 and 34, 22 and 38, 24 and 40, and 20 and 36, so connected, forms the well-known Cascode configuration, thereby controlling Miller effect by preventing the collectors of the respective transistors 18, 22, 24 and 20 from swinging substantially in response to changes in the differential input signals. Controlling Miller effect is significant because that effect, if not controlled, can dominate the high frequency performance of the amplifier by effectively gain-multiplying the collector-base junction capacitance of the input transistors. Preferably, the geometries of the transistors 34, 36, 38 and 40 are scaled relative to the geometries of transistors 18, 20, 22 and 24 so as to minimize the parasitic capacitances introduced by the junctions thereof.

Disregarding the transistors 34, 36, 38 and 40, the collectors of the transistors 18 and 22 of the non-inverting side 17 of the differential pairs are connected at a first current summing node 42, and the collectors of transistors 20 and 24 of the inverting side 15 of the differential pairs are connected at a second current summing node 44. The first and second current summing nodes 42 and 44 are connected to output terminals 46 and 48, respectively.

Output current $I_{out+}$ is produced at output terminal 46 and output current $I_{out-}$ is produced at output terminal 48. Because the differential pairs' collector currents are summed in phase at each node 42 and 44, the output currents $I_{out+}$ and $I_{out-}$ are, for a given differential input voltage, approximately double the output currents that would be provided by one differential pair alone. Even at the $f_T$ frequency of the amplifier's component transistors where the current gain of the transistors has fallen to unity, the main amplifier 10 produces a current gain of approximately 2. Under the practical assumption that current gain decreases proportional to increasing frequency, the main amplifier current gain does not fall to unity until approximately twice the $f_T$ frequency of the transistors. Consequently, the design of the main amplifier 10 effectively produces an $f_T$ doubling so that the amplifier is operative at higher frequencies than its component transistors.

The emitters of differential pair transistors 18, 20, 22 and 24 are connected to respective pairs of constant current sources 50 and 52, 54 and 56, 58 and 60, and 62 and 64. Through these current sources, the emitters of such transistors are connected to a suitable negative voltage supply $V_{EE}$.

Interposed between the emitters of transistors 18, 20, 22 and 24 and respective current sources 52, 56, 60 and 64 is the error cancellation circuitry 16. The error cancellation circuitry 16 comprises a pair of error cancellation amplifiers 65 and 71 implemented as degenerated differential pairs. It is to be recognized that the circuitry 16 may be implemented in other ways, without departing from the principles of the invention.

The first error cancellation amplifier 65 comprises transistors 66 and 68, the emitters of which are coupled together through a resistor 70° Similarly, the second error cancellation amplifier 71 comprises transistors 72 and 74, the emitters of which are coupled together through a resistor 76. So as to provide error cancellation current to each of the output terminals 46 and 48, each error cancellation amplifier 65 and 71 has one of its transistors' collectors coupled to an emitter of a transistor on the non-inverting side of the main amplifier's differential pairs and the other of its transistors' collectors coupled to an emitter of a transistor on the inverting side of the main amplifier's differential pairs. In addition, each error cancellation amplifier 65 and 71 has one of its transistors' collectors coupled to an emitter of a transistor of an outer differential pair and the other of its transistor's collectors coupled to an emitter of a transistor of an inner differential pair.

The preferred manner of implementing the above-described couplings of the error cancellation amplifier to the main amplifier is shown in FIG. 1. The first error cancellation amplifier 65 has the collector of its transistor 66 coupled to the emitter of the transistor 22 on the non-inverting side of the inner differential pair, while the collector of its transistor 68 is coupled to the emitter of the transistor 20 on the inverting side of the outer differential pair. Similarly, the second error cancellation amplifier 71 has the collector of its transistor 72 coupled to the emitter of the transistor 18 on the non-inverting side of the outer differential pair, while the collector of its transistor 74 is coupled to the emitter of the transistor 24 on the inverting side of the inner differential pair.

The first and second error cancellation amplifiers 65 and 71 have standing currents provided by, respectively, the constant current sources 56 and 60, and 52 and 64. The standing current used in the error cancellation circuitry 16 is thereby reused in powering the main amplifier 10. Accordingly, error cancellation circuitry 16 introduces substantially no change in the amplifier's device power dissipation.

The bases of each of the error cancellation amplifiers' transistors are coupled, respectively, to one of the level shifter stages 12 or 14, or to one of the emitters of the inner differential pair transistors 22 or 24. Specifically, the first error cancellation amplifier 65 has the base of its transistor 66 coupled to the first level shifter stage 12 and has the base of its transistor 68 coupled to the emitter of the transistor 22. Similarly, the second error cancellation amplifier 71 has the base of its transistor 74 coupled to the second level shifter stage 14 and has the base of its transistor 72 coupled to the emitter of the transistor 24.

The first and second level shifter stages 12 and 14 have equivalent configurations. The first level shifter stage 12 comprises transistors 78, 80 and 82, and the second level shifter stage 14 comprises transistors 84, 86 and 88. The differential input signals $V_{in+}$ and $V_{in-}$ are applied via input terminals 30 and 32 to the bases of transistors 78 and 84, respectively, of the level shifter stages 12 and 14. The standing current of the first and second level shifter stages 12 and 14 is supplied by constant current sources 90 and 92, respectively. The constant current source 90 is coupled to the emitters of the transistors 80 and 82 of the first level shifter stage 12. Similarly, the constant current source 92 is coupled to the emitters of the transistors 86 and 88 of the second level shifter stage 14.

The standing current of each of the first and second level shifter stages 12 and 14 is reused to bias the emitters of respective cascode transistors 34, 38, 40 and 36, this reused bias current hereinafter referred to as "keep-alive current". As described above, the cascode transistors 34, 38, 40 and 36 are provided to prevent the collectors of the main amplifier transistors 18, 22, 24 and 20 from swinging substantially in response to changes in the differential input signals and, thereby, control Miller effect. However, the emitters of the cascode transistors 34, 38, 40 and 36, in the absence of keep-alive current, may themselves swing significantly when the main amplifier 10 is overdriven. Overdriving may turn off cascode transistors, in which case the emitters of any turned-off cascode transistor may float to the fixed voltage of its base, i.e., $V_{be}=0$ implies $V_e=V_b=V_{CSCD}$. Moreover, in the presence of leakage currents across the turned-off cascode transistor's junctions, the emitter voltage may float to the voltage of the transistor's collector, that is, to the rail voltage (not shown). Thereafter, to turn on any then-off cascode transistor, the transistor's parasitic junction capacitances must be discharged, introducing an undesirably long overdrive recovery time. Accordingly, the keep-alive currents are provided to the cascode transistors at values predetermined to bias the cascode transistors' emitters so as to counteract such undesirable overdrive effects and maintaining control of Miller effect.

The first and second level shifter stages 12 and 14 may have various configurations; however, the configuration shown in FIG. 1 has the advantage of providing keep-alive currents to each of the cascode transistors. In addition, the configuration shown in FIG. 1 is also known to provide $f_T$ doubling transistor operation.

The differential input signals $V_{in+}$ and $V_{in-}$ are applied respectively to the bases of the first and second error cancellation amplifiers' transistors 66 and 74 after being level shifted by the first or the second level shifter stages 12 or 14. The differential input signal $V_{in+}$ is level shifted, in the first level shifter stage 12, by the voltage drops across the base-emitter junctions of the transistors 78 and 80, or the transistors 78 and 82. The differential input signal $V_{in-}$ is level shifted, in the second level shifter stage 14, by the voltage drops across the base-emitter junctions of the transistors 84 and 86, or the transistors 84 and 88.

The differential input signals $V_{in+}$ and $V_{in-}$ are also applied respectively to the bases of the error cancellation amplifiers' transistors 68 and 72, respectively, after being level shifted by the voltage drops across the base-emitter junctions of the transistors 18 and 22, or the transistors 20 and 24 of the main amplifier 10.

The level shifts of the first and second level shifter stages 12 and 14 are nominally matched, as are the level shifts of the transistors on either side of the main amplifier 10, when the differential input signals are balanced, i.e., $V_{in+} = V_{in-}$. It is also preferred, when the differential input signals are balanced, that the level shifts of the first and second level shift stages 12 and 14 substantially match the level shifts of the corresponding sides of the main amplifier 10. However, such matching of level shifts between either level shifting stage 12 or 14 and the corresponding side of the main amplifier is not required for proper operation of the transistor amplifier. The important point is that the level shifts therebetween are sufficiently matched so that, when the differential input signals are balanced at input terminals 30 and 32, substantial centering of the error cancellation amplifiers 65 and 71 in their respective dynamic ranges is provided; in that way, when the differential input signals are not balanced, neither of the error cancellation amplifiers 65 and 71 is likely to be driven outside its dynamic range. It is also to be recognized that nominal, but substantially matched differences in the level shifts of (i) the level shifter stage 12 versus its corresponding transistors of the main amplifier 10, and (ii) the level shifter stage 14 versus its corresponding transistors of the main amplifier 10, for balanced differential input signals, generally results in the error cancellation currents generated by one of the amplifiers 65 or 71 being canceled, at the respective summing nodes 42 and 44, by the error cancellation currents generated by the other amplifier 71 or 65. That is, as discussed further in the following paragraphs, net error cancellation current ideally is not generated by the error cancellation circuitry 16 when voltage drops are matched across the base-emitter junctions of the respective, opposed transistors of the differential pairs of the main amplifier 10.

The inner and outer differential pairs produce the transistor amplifier's gain, as well as error currents. Error currents result when the differential input signals are not balanced, leading to unequal standing currents flowing through the emitters of differentially opposed transistors. The errors, more specifically, arise due to the nonlinearity of each transistor's $V_{be}$ over variations in emitter current, and due to thermal distortion. The error cancellation circuitry 16 senses the differential $V_{be}$ errors across differentially opposed transistors for each of the outer and inner differential pairs. In response thereto, the error cancellation circuitry 16 generates the error cancellation currents necessary to cancel the error currents resulting from these differential $V_{be}$ errors.

It is known that $V_{be}$ is a function of both emitter current and temperature, as approximated by the equation:

$$V_{be} = V_T * \ln(I/I_{se})$$

where $V_{be}$ is the base-emitter junction voltage of a transistor, I is the current through the emitter of the transistor, $I_{se}$ is the reverse saturation current of the base-emitter junction (a function of temperature), and $V_T$ is the thermal voltage. $V_T$ is given by the equation:

$$V_T = kT/q$$

where k is the Boltzmann constant, T is the absolute temperature in degrees Kelvin and q is the charge of an electron in Coulombs. Thence, the $V_{be}$ of a transistor is a nonlinear function of the transistor's emitter current, and is subject to thermal distortion resulting from both the reverse saturation current $I_{se}$ and the thermal voltage $V_t$ being functions of temperature.

Applying these equations to the circuit of FIG. 1, it is apparent that, when $V_{in+}$ and $V_{in-}$ are not balanced, differences in $V_{be}$ across opposed transistors 18 and 20, and across opposed transistors 22 and 24, arise directly from differences in the transistors' emitter currents. It is also apparent that differences in $V_{be}$ across such transistor pairs arise indirectly from such current differences because such current differences cause variations in power dissipation that, in turn, lead to differing temperatures between such transistors and, therefore, differences in thermal distortion therebetween. These differences in $V_{be}s$ across such transistor pairs are the differential $V_{be}$ errors sensed and canceled by the error cancellation circuitry 16.

The error cancellation circuitry 16 senses differential $V_{be}$ errors in series. More specifically, the error cancellation amplifiers 65 and 71 sense such errors by comparing (i) the respective differential input signal as level shifted by level shifter stage 12 or 14, to (ii) the respective differential input signal as level shifted by the corresponding transistors of the main amplifier 10. The error cancellation amplifiers 65 and 71, in effect, subtract the results of those comparisons to generate the net error cancellation current.

Because the level shifter stages 12 and 14 are driven at constant currents by the respective constant current sources 90 and 92, differential $V_{be}$ errors detected in such comparisons result substantially from nonlinearities and thermal distortion between differentially opposed transistors of the main amplifier 10. That is, errors associated with the respective level shifter stages 12 or 14 are substantially negligible.

If the errors detected by error cancellation amplifier 65 are equal in magnitude and opposite in phase to the errors detected by error cancellation amplifier 71, the error cancellation currents generated by the error cancellation amplifiers 65 and 71, if any, substantially cancel each other. That is, any common mode $V_{be}$ errors are rejected by the overall operation of the error cancellation amplifiers 65 and 71.

To illustrate the operation of the circuitry 16, assume $V_{in-}$ exceeds $V_{in+}$. In that case, the transistors 20 and 24 of the inverting side of the main amplifier 10 experience increased emitter current, which is desirable. However, the respective $V_{be}$S of the transistors 20 and 24 are also subject to errors of nonlinearity and thermal distortion associated with changes in emitter current, as approximated by the equations set forth above. Similarly, differentially opposed transistors 18 and 22 are subject to corresponding, generally different $V_{be}$ errors due to changes in their respective emitter currents.

The differential $V_{be}$ error between transistors 18 and 20 generates an error current flowing through the resistor 26 in the direction shown in FIG. 1, that direction being opposite the direction of the output current $I_{out-}$, also shown in FIG. 1. The series $V_{be}$ errors of transistors 20 and 24 are applied to the base of the second error cancellation amplifier's transistor 72, in the form of a lower potential thereon. In contrast, essentially no $V_{be}$ errors are applied to the base of that cancellation amplifier's transistor 74. (Essentially no $V_{be}$ errors are applied to transistor 74 because the currents through the emitters of the second level shifter stage 14 are substantially independent of changes in the input signal, i.e., they are determined by the constant current source 92.) Accordingly, the second error cancellation amplifier 71 generates an error cancellation current across the resistor 76 that is in the direction shown in FIG. 1, and that is responsive to the $V_{be}$ error voltages of the main amplifier's transistors.

The error cancellation current, so generated, causes an increase in the collector current of transistor 74 and a decrease in the collector current of transistor 72. Because the emitter of transistor 24 is coupled to the collector of transistor 74, the increase in the collector current of transistor 74 increases the emitter current of transistor 24, thereby increasing via second current summing node 44 the current drawn from output terminal 48 and canceling the error current generated by the main amplifier 10.

Similarly, error cancellation currents are generated by the first error cancellation amplifier 65 in compensating for differential $V_{be}$ errors. In this regard, it is important to recognize that the two collectors of each error cancellation amplifier 65 and 71 are cross-coupled so that each cancellation amplifier 65 and 71 may contribute cancellation current to both sides of the main amplifier 10.

As shown in FIG. 1, the emitters of the transistors 18, 22, 24 and 20 are connected to respective constant current sources 50, 58, 62 and 54. Although shown, such constant current sources may be omitted in certain applications without departing from the principles of the invention. Whether these current sources are included or omitted, the sum of the currents generated by the constant current sources of the transistor amplifier is substantially constant.

In connecting the first and second error cancellation amplifiers 65 and 71 to the emitters of the transistors of the outer and inner differential pairs, positive feedback arises in the error cancellation amplifiers due to the intrinsic emitter impedance $r_e$ of the main amplifier's transistors 18, 20, 22 and 24. This positive feedback can degrade the transistor amplifier's performance. To illustrate, as the main amplifier 10 is overdriven by the differential input signal, two of the main amplifier's transistors may approach shut-off, thereby enlarging their intrinsic emitter impedances, directing more positive feedback to the error cancellation amplifiers, thereby increasing their gain and making the composite amplifier response expansive, that is, making a small change in the input current result in an undesirably larger change in the output current. To control feedback, a predetermined bias current is routed directly to the emitters of the transistors 18, 22, 24 and 20 of the main amplifier 10 using the constant current sources 50, 58, 62 and 54, respectively. So routing bias current, the error cancellation amplifiers 65 and 71 are made to operate on only a portion of the bias current of the main amplifier 10, such that the amplifiers will shut off as the corresponding main amplifier transistor is shutting off, so that the gain of the error cancellation amplifier 65 or 71 is decreasing at approximately the same rate that positive feedback is increasing that gain. Accordingly, the gain of the error cancellation amplifiers 65 and 71 are maintained substantially constant throughout the transistor amplifier's dynamic range.

The gains of the error cancellation amplifiers 65 and 71 are predetermined so that the error cancellation currents generated thereby will be substantially equal, but opposite, to the error currents generated in the main amplifier 10. As shown in FIG. 1, the outer differential pair transistors 18 and 20, and the resistor 26, generate roughly one half of the output currents $I_{out+}$ and $I_{out-}$ while being subject to one differential $V_{be}$ error between the transistors thereof with respect to the differential input signal. The inner differential pair transistors 22 and 24, and the resistor 28, generate the other roughly one half of the output currents $I_{out+}$ and $I_{out-}$ while being subject to two differential $V_{be}$ errors with respect to the differential input signal, i.e., the differential input signal is applied to the bases of the transistors 22 and 24 after being level shifted by the base-emitter junctions of the transistors 18 and 20 of the outer differential pair. Thence, the average differential $V_{be}$ error of the main amplifier 10 is approximately 1.5 times the differential $V_{be}$ error of the outer differential pair. Because the error cancellation amplifiers 65 and 71 sense the differential $V_{be}$ errors of the outer and inner differential pairs in series and generate error cancellation currents in parallel, the gain of each error cancellation amplifier 65 and 71 may be set to a coarse approximation of ¾ of the gain of the main amplifier 10.

Although not required, it is preferred that the transistor amplifier of the present invention be implemented as an integrated circuit. This is particularly desirable so as to match the characteristics of differentially opposed devices. For example, it is desirable to match the characteristics of the transistors 18 and 20, the transistors 22 and 24, the transistors of each error cancellation amplifier 65 and 71, the transistors of the first and second level shifter stages 12 and 14, and the cascode transistors, as well as matching the constant current sources 60 and 64, 56 and 52, 58 and 62, and 54 and 50. Generally, it may not be desirable to match the characteristics of the constant current sources 60 and 56, or 64 and 52, or constant current sources 58 and 54, or 62 and 50.

While the foregoing discussion is based on the use of bipolar transistors, the principles set forth may be extended to other active devices, such as field-effect transistors.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An amplifier circuit for receiving an input signal and producing enhanced gain thereof at high frequencies, said amplifier circuit comprising:

first and second output terminals;

a main amplifier comprising an inner differential pair of amplifying devices and an outer pair of amplifying devices, each of said differential pairs receiving the input signal and having an inverting side and a non-inverting side, said inverting sides being coupled to said first output terminal and said non-inverting sides being coupled to said second output terminal; and error cancellation circuitry coupled to said main amplifier so as to provide error cancellation current to said main amplifier, said error cancellation circuitry including at least one additional differential pair with one transistor collector coupled to said non-inverting side of one of said outer or inner differential pairs, and an other transistor collector coupled to said inverting side of the other of said outer or inner differential pairs, so as to contribute error cancellation current to both of said sides in said main amplifier.

2. The amplifier circuit of claim 1, wherein said amplifying devices of said outer differential pair comprise a first transistor and a second transistor, the collector of said first transistor being coupled to said first output terminal and the collector of said second transistor being coupled to said second output terminal.

3. The amplifier circuit of claim 2, wherein said amplifying devices of said inner differential pair comprise a third transistor and a fourth transistor, the collector of said third transistor being coupled to said first output terminal and the collector of said fourth transistor being coupled to said second output terminal.

4. The amplifier circuit of claim 3, wherein said first and second transistors are coupled together at their emitters through a first resistor, said third and fourth transistors are coupled together at their emitters through a second resistor, and the base of said third transistor is coupled to the emitter of said first transistor and the base of said fourth transistor is coupled to the emitter of said second transistor.

5. The amplifier circuit of claim 4, further comprising a plurality of power current sources coupled to respective emitters of said transistors of said main amplifier, so as to power said main amplifier.

6. The amplifier circuit of claim 5, wherein said error cancellation circuitry is interposed between said main amplifier and at least one of said power current sources, so as to reuse the current of said power current sources to power the error cancellation circuitry.

7. The amplifier circuit of claim 5, wherein said error cancellation circuitry comprises first and second error cancellation amplifiers, each of said error cancellation amplifiers comprising a degenerated differential pair of first and second transistors.

8. The amplifier circuit of claim 7, wherein the collector of said first transistor of said first error cancellation amplifier is connected to the emitter of said third transistor of said main amplifier and the collector of said second transistor of said first error cancellation amplifier is connected to the emitter of said second transistor of said main amplifier.

9. The amplifier circuit of claim 8, wherein the collector of said first transistor of said second error cancellation amplifier is connected to the emitter of said fourth transistor of said main amplifier and the collector of said second transistor of said second error cancellation amplifier is connected to the emitter of said first transistor of said main amplifier.

10. The amplifier circuit of claim 7, wherein each emitter of said transistors of said first and second error cancellation amplifiers is connected to a respective one of said power current sources.

11. The amplifier circuit of claim 10, further comprising a plurality of bias current sources, each of said bias current sources being connected to a respective transistor collector of said error cancellation amplifiers and to a respective transistor emitter of said differential pairs of said main amplifier, so as to control positive feedback in said error cancellation amplifier.

12. The amplifier circuit of claim 11, wherein, for at least one of said transistors of said error cancellation amplifiers, said bias current source connected to said collector of said transistor provides a current of a first predetermined value and said power current source connected to said emitter of said transistor provides a current of a second predetermined value, said first and second predetermined values having a predetermined ratio so as to provide for accurate error cancellation current by said error cancellation amplifier.

13. The amplifier circuit of claim 11, wherein said error cancellation amplifiers have predetermined gains, so that the error cancellation currents generated by said error cancellation amplifiers will be substantially equal, but opposite, to the error currents generated in said main amplifier.

14. The amplifier circuit of claim 11, further comprising Miller effect control means, connected to at least one of said transistors, for controlling Miller effect.

15. The amplifier circuit of claim 11, further comprising first, second, third and fourth cascode-configured transistors, said first and second cascode-configured transistors having their respective bases tied to a common, substantially-fixed bias voltage source, having their collectors coupled to respective first and second output terminals and having their emitters coupled to respective collectors of said first and second transistors of said outer differential pair, and said third and fourth cascode-configured transistors having their respective bases tied to respective emitters of said first and second cascode-configured transistors, having their collectors coupled to respective first and second output terminals and having their emitters coupled to respective collectors of said third and fourth transistors of said inner differential pair, at least one of said cascode-configured transistors being provided with a keep-alive current, so as to bias said cascode-configured transistor to a predetermined operating range.

16. The amplifier circuit of claim 11, further comprising first and second level shifter stages connected respectively to the bases of said first transistors of said error cancellation amplifiers, said first and second level shifting stages shifting the level of the input signal by an amount substantially equal to the shift of the input signal introduced by said main amplifier relative to the bases of said error cancellation amplifiers.

17. The amplifier circuit of claim 16, further comprising a bias current source to which at least one of said level shifter stages is connected, and a fifth transistor connected to at least one of said transistors of said differential pairs so as to form a cascode configuration, said fifth transistor being connected to said bias current source through said level shifter stage so as to bias said fifth transistor to a predetermined operating range.

18. The amplifier circuit of claim 16, wherein at least one of said level shifter stages comprises an amplifier circuit providing effective $f_T$ doubling operation.

19. An amplifier circuit for receiving an input signal and producing enhanced gain thereof at high frequencies, said amplifier circuit comprising:
first and second output terminals;
a main amplifier comprising an inner differential pair of amplifying devices and an outer pair of amplifying devices, each of said differential pairs receiving the input signal and having an inverting side and a non-inverting side, said inverting sides being coupled to said first output terminal and said non-inverting sides being coupled to said second output terminal;
a power current source; and
error cancellation circuitry providing error cancellation current to said main amplifier, said error cancellation circuitry being interposed between said main amplifier and said power current source, so as to reuse the current of said power current source to power the error cancellation circuitry, said error cancellation circuitry including at least one additional differential pair with one transistor collector coupled to said non-inverting side of one of said outer or inner differential pairs, and an other transistor collector coupled to said inverting side of the other of said outer or inner differential pairs, so as to contribute error cancellation current to both of said sides in said main amplifier.

20. The amplifier circuit of claim 19, wherein said error cancellation circuitry comprises first and second error cancellation amplifiers, each of said error cancellation amplifiers comprising a degenerated differential pair of first and second transistors.

21. The amplifier circuit of claim 20, wherein said power current source is connected to at least one of the emitters of said transistors of said error cancellation amplifiers.

22. The amplifier circuit of claim 21, further comprising a bias current source connected to one of the transistor collectors of said error cancellation amplifiers and to a respective differential pair of said main amplifier, so as to control positive feedback in said error cancellation amplifier.

23. The amplifier circuit of claim 22, wherein the current of said bias current source is a first predetermined value and the current of said power current source is a second predetermined value, said first and second predetermined values having a predetermined ratio so as to provide for accurate error cancellation current by said error cancellation amplifier.

24. The amplifier circuit of claim 20, wherein said error cancellation amplifiers have predetermined gains, so that the error cancellation currents generated by said error cancellation amplifiers will be substantially equal, but opposite, to the error currents generated in the main amplifier.

25. The amplifier circuit of claim 20, further comprising first and second level shifter stages connected respectively to the bases of said first transistors of said error cancellation amplifiers, said first and second level shifter stages shifting the level of the input signal by an amount substantially equal to the shift of the input signal introduced by said main amplifier relative to the bases of said error cancellation amplifiers.

26. The amplifier circuit of claim 25, wherein at least one of said level shifter stages comprises an amplifier circuit providing effective $f_T$ doubling operation.

27. The amplifier circuit of claim 25, further comprising Miller effect control means for controlling effects of circuit capacitances at high frequencies, said control means being connected through at least one of said level shifter stages to a bias current source, so as to bias said control means to a predetermined operating range.

* * * * *